(12) United States Patent
Shouche et al.

(10) Patent No.: US 10,425,045 B2
(45) Date of Patent: Sep. 24, 2019

(54) INPUT PROTECTION CIRCUIT FOR AN ANALOG OPTOCOUPLER

(71) Applicant: Micro Motion, Inc., Boulder, CO (US)

(72) Inventors: Ulhas Arun Shouche, Pune (IN);
William M. Mansfield, Niwot, CO (US); Vishal Vishwasrao Bhosale, Pune (IN)

(73) Assignee: Micro Motion, Inc., Boulder, CO (US)

(*) Notice: Subject to any disclaimer, the term of this patent is extended or adjusted under 35 U.S.C. 154(b) by 0 days.

(21) Appl. No.: 15/736,936

(22) PCT Filed: Jun. 25, 2015

(86) PCT No.: PCT/US2015/037734
§ 371 (c)(1),
(2) Date: Dec. 15, 2017

(87) PCT Pub. No.: WO2016/209239
PCT Pub. Date: Dec. 29, 2016

(65) Prior Publication Data
US 2018/0175810 A1    Jun. 21, 2018

(51) Int. Cl.
| | |
|---|---|
| H03F 1/52 | (2006.01) |
| H03F 3/08 | (2006.01) |
| H03F 3/217 | (2006.01) |
| H04B 10/80 | (2013.01) |
| H03K 17/78 | (2006.01) |

(52) U.S. Cl.
CPC .............. *H03F 1/52* (2013.01); *H03F 3/085* (2013.01); *H03F 3/217* (2013.01); *H03K 17/78* (2013.01); *H04B 10/802* (2013.01); *H03F 2200/261* (2013.01); *H03F 2200/444* (2013.01)

(58) Field of Classification Search
CPC ........................................................ H03F 1/52
USPC .............................................. 330/298, 207 P
See application file for complete search history.

(56) References Cited

U.S. PATENT DOCUMENTS

| | | | | |
|---|---|---|---|---|
| 4,117,411 | A * | 9/1978 | Goble .................... | G08C 19/22 330/10 |
| 5,218,315 | A * | 6/1993 | Turner .................. | H03F 3/2171 330/10 |
| 5,245,654 | A * | 9/1993 | Wilkison ............ | H04M 7/0096 379/345 |
| 5,734,261 | A * | 3/1998 | Knudsen .................. | H03F 1/52 323/276 |
| 5,760,730 | A   | 6/1998 | Fischer et al. | |

(Continued)

FOREIGN PATENT DOCUMENTS

| | | |
|---|---|---|
| DE | 3305627 A1 | 8/1984 |
| DE | 102010062310 A1 | 6/2012 |

(Continued)

*Primary Examiner* — Henry Choe
(74) *Attorney, Agent, or Firm* — The Ollila Law Group LLC

(57) ABSTRACT

An input protection circuit (110) for an optocoupler (20) is provided. The input protection circuit (110) includes a first voltage limiter (D1) with a first terminal that is electrically coupled to an input terminal of an amplifier circuit (120), wherein the input terminal of the amplifier circuit (120) is configured to receive a PWM signal and the amplifier circuit (120) is configured to provide a voltage to the optocoupler (20).

12 Claims, 5 Drawing Sheets

(56) References Cited

U.S. PATENT DOCUMENTS

| | | | |
|---|---|---|---|
| 6,577,509 B2 * | 6/2003 | Deboy | H02M 3/33507 |
| | | | 363/20 |
| 6,903,912 B2 * | 6/2005 | Kranister | H02M 1/32 |
| | | | 323/276 |
| 9,660,476 B2 * | 5/2017 | Flock | B60L 3/04 |
| 2004/0261120 A1 | 12/2004 | Zhang et al. | |
| 2005/0069326 A1 | 3/2005 | Onde et al. | |
| 2006/0250290 A1 | 11/2006 | Lauritzen et al. | |
| 2008/0037807 A1 | 2/2008 | Honda | |
| 2014/0139962 A1 | 5/2014 | Voss | |

FOREIGN PATENT DOCUMENTS

| | | |
|---|---|---|
| EP | 0050417 A1 | 4/1982 |
| EP | 0066180 A2 | 12/1982 |
| EP | 0821502 A2 | 1/1998 |
| JP | S58111515 U | 7/1983 |
| JP | S62177116 U | 11/1987 |
| WO | 9307668 A1 | 4/1993 |

* cited by examiner

INPUT PROTECTION CIRCUIT FOR AN ANALOG OPTOCOUPLER

TECHNICAL FIELD

The embodiments described below relate to optocouplers and, more particularly, to an input protection circuit for an analog optocoupler.

BACKGROUND

Industrial equipment may be coupled to a communications bus. Using the communications bus, the industrial equipment can communicate with other industrial equipment or devices coupled to the communications bus. For example, a flow measurement and a flow control device may be coupled to a common pipeline that carries a material. The flow measurement and flow control device may communicate with each other over the communications bus to control a property of the material. More specifically, the flow measurement device may measure the properties of the material and provide the measurements to the communications bus. The flow control device may control the properties of the material using the measurements obtained from the communications bus.

The industrial equipment frequently employ, or are exposed to, high voltages. In addition, the communications bus typically include electrical conductors. As a result, there is potential that the high voltages will electrically couple to the communications bus. This can damage the other equipment or devices coupled to the communications bus and cause catastrophic events. Therefore, many safety regulations require that the communications bus be electrically isolated from the industrial equipment. The safety regulation may also specify a minimum isolation voltage rating for the electrical isolation.

Optocouplers are used to isolate the communications bus from the industrial equipment. The optocouplers employ an isolation barrier. The isolation barrier may be a transparent dielectric with a maximum isolation voltage rating, which may be greater than the minimum isolation voltage rating specified by the safety regulation. A light emitting diode (LED) is on one side of the isolation barrier and a photodiode is on the other side of the isolation barrier. The LED may be coupled to, for example, a controller that is in communication with the industrial equipment and the photodiode may be coupled to the communications bus. The LED side of the isolation barrier is commonly referred to as the non-intrinsically safe (non-IS) portion and the photodiode side of the isolation barrier is commonly referred to as the intrinsically safe (IS) portion.

The optocouplers are prone to issues that adversely affect a relationship between an input and an output of the optocoupler. For example, the output from the optocoupler may not be linearly related to a voltage or current applied to the optocoupler's input. The non-linearity may be due to the LED's sensitivity to temperature, a drift in the LED's brightness, etc.

High-linearity optocouplers may address these issues. The high-linearity optocouplers may include a feedback photodiode in the non-IS portion. An external amplifier can be used with the feedback photodiode to monitor the light output of the LED and automatically adjust the LED current to compensate for any non-linearities or changes in the light output of the LED. The feedback amplifier acts to stabilize and linearize the light output of the LED.

FIG. 1 shows an exemplary optocoupler 20, which may be a high-linearity optocoupler, that is communicatively coupled to an optodriver circuit 10. The optodriver circuit 10 receives a signal at an input IN. The signal can be in any appropriate form, but for the sake of discussion, the signal received at the input IN is a pulse width modulation (PWM) signal. The optodriver circuit 10 may convert the PWM signal to an analog signal that may be proportional to the PWM signal. The optodriver circuit 10 may also filter and amplify the analog signal and provide the filtered and amplified analog signal ("conditioned signal") to the optocoupler 20.

As shown in FIG. 1, the conditioned signal is provided to an LED 22. The LED 22 emits light in response to the conditioned signal. A first photodiode 24 and a second photodiode 26 receive the emitted light. An isolation barrier 28 is between the LED 22 and the second photodiode 26. Therefore, the output OUT of the optocoupler 20 is electrically isolated from the input IN. The first photodiode 24 provides a feedback signal to the amplifier circuit 12. The amplifier circuit 12 receives the feedback signal and adjusts the conditioned signal. Accordingly, the light emitted from the LED 22 may be controlled to ensure that the light emitted by the LED 22 is proportional to the signal received by the amplifier circuit 12. However, the output OUT does not have a linear relationship with the input IN, even if the optocoupler 20 is employed, as is explained in more detail in the following.

The safety regulations also typically limit a voltage that may be applied to the LED 22 and the first photodiode 24 to a maximum voltage. Voltage limiters 14 and 16 shown in FIG. 2 may limit the voltage applied to the LED 22 and the first photodiode 24. The voltage limiters 14, 16 are configured to conduct current to ground if the voltage applied to the LED 22 or the first photodiode 24 is greater than a breakdown voltage of the voltage limiters 14 and 16. The breakdown voltage of the voltage limiters 14 and 16 may be less than the maximum voltage specified by the safety regulation.

A typical configuration of the voltage limiters 14 and 16 are shown in FIG. 3. In the typical configuration, the voltage limiters 14 and 16 are Zener diodes D1, D2, D3. The Zener diodes D1, D2, D3 are electrically coupled to the LED 22 and the first photodiode 24. As can also be seen, the optodriver circuit 10 also includes resistors R1, R2, R3 and fuses F1, F2, F3 that protect the Zener diodes D1, D2, D3. A low pass filter (LPF) filters the signal received at the input IN.

The Zener diodes D1, D2, D3 are not perfect insulators below the breakdown voltage. That is, the Zener diodes D1, D2, D3 may have a leakage current, which can vary from diode to diode, at an operating voltage. For example, the first Zener diode D1 may have a leakage current that is less than the leakage current through the third Zener diode D3. This can cause the conditioned signal provided to the LED 22 to vary. As a result, the output OUT does not have a linear relationship to the input IN.

In other words, the relationship between the input IN and output OUT is not linear due to the configuration of the Zener diodes D1, D2, D3 shown in FIG. 3. Accordingly, there is a need for an input protection circuit for an analog optocoupler and, in particular, an input protection circuit that does not cause variations in the conditioned signal provided to the optocoupler.

SUMMARY

An input protection circuit for an optocoupler is provided. According to an embodiment, the input protection circuit comprises a first voltage limiter with a first terminal that is electrically coupled to an input terminal of an amplifier circuit, wherein the input terminal of the amplifier circuit is configured to receive a PWM signal and the amplifier circuit is configured to provide a voltage to the optocoupler.

An optodriver circuit is provided. According to an embodiment, the optodriver circuit comprises an amplifier circuit that is configured to provide a voltage to an optocoupler and an input protection circuit. The input protection circuit comprises a first voltage limiter with a first terminal, wherein the first terminal is electrically coupled to an input terminal on the amplifier circuit and the input terminal on the amplifier circuit is configured to receive a PWM signal.

Aspects

According to an aspect, an input protection circuit (110) for an optocoupler (20), comprises a first voltage limiter (D1) with a first terminal that is electrically coupled to an input terminal of an amplifier circuit (120), wherein the input terminal of the amplifier circuit (120) is configured to receive a PWM signal and the amplifier circuit (120) is configured to provide a voltage to the optocoupler (20).

Preferably, the input protection circuit (110) further comprises a buffer (114) with an input terminal electrically coupled to the first terminal of the first voltage limiter (D1) and an output terminal electrically coupled to the input terminal of the amplifier circuit (120).

Preferably, the input protection circuit (110) further comprises a second voltage limiter (D2) having a first terminal, wherein the first terminal of the second voltage limiter (D2) is electrically coupled to a voltage reference (112) that provides a protected reference voltage to the optocoupler (20) and an amplifier circuit (120).

Preferably, the first voltage limiter (D1) further comprises a second terminal, wherein the second terminal of the first voltage limiter (D1) is coupled to a protected ground (GND_P) and the second voltage limiter (D2) further comprises a second terminal, wherein the second terminal of the second voltage limiter (D2) is coupled to the protected ground (GND_P).

Preferably, the input protection circuit (110) further comprises a voltage reference (112) that is electrically coupled to the amplifier circuit (120) to provide a reference voltage to the amplifier circuit (120).

Preferably, the input protection circuit (110) further comprises a first fuse (F1) coupled between a protected ground (GND_P) and a digital ground (DGND).

Preferably, the input protection circuit (110) further comprises a second fuse (F2) coupled to an input terminal on the amplifier circuit (120).

Preferably, the amplifier circuit (120) is electrically coupled to a light emitting diode (22) and a first photodiode (24) in the optocoupler (20), wherein the amplifier circuit (120) controls a voltage applied to the light emitting diode (22) based on a signal provided at an input pin (IN) to compensate and maintain a constant current in the first photodiode (24).

Preferably, the amplifier circuit (120) provides the optocoupler (20) with a filtered and amplified analog signal which is proportional to a pulse width modulation signal received at the input terminal of the amplifier circuit (120).

According to an aspect, an optodriver circuit (100) comprises an amplifier circuit (120) that is configured to provide a voltage to an optocoupler (20) and an input protection circuit (110) comprising a first voltage limiter (D1) with a first terminal, wherein the first terminal is electrically coupled to an input terminal on the amplifier circuit (120) and the input terminal on the amplifier circuit (120) is configured to receive a PWM signal.

Preferably, the optodriver circuit (100) further comprises a buffer (114) with an input terminal electrically coupled to the first terminal of the first voltage limiter (D1) and an output terminal electrically coupled to the input terminal of the amplifier circuit (120).

Preferably, the optodriver circuit (100) further comprises a second voltage limiter (D2) having a first terminal, wherein the first terminal of the second voltage limiter (D2) is electrically coupled to a voltage reference (112) that provides a protected reference voltage to the optocoupler (20) and an amplifier circuit (120).

Preferably, the first voltage limiter (D1) further comprises a second terminal, wherein the second terminal of the first voltage limiter (D1) is coupled to a protected ground (GND_P) and the second voltage limiter (D2) further comprises a second terminal, wherein the second terminal of the second voltage limiter (D2) is coupled to the protected ground (GND_P).

Preferably, the optodriver circuit (100) further comprises a voltage reference (112) that is electrically coupled to the amplifier circuit (120) to provide a reference voltage and a protected voltage to the amplifier circuit (120).

Preferably, the amplifier circuit (120) is electrically coupled to a light emitting diode (22) and a first photodiode (24) in the optocoupler (20), wherein the amplifier circuit (120) controls a voltage applied to the light emitting diode (22) based on a signal provided at an input pin (IN) to compensate and maintain a constant current in the first photodiode (24).

Preferably, the amplifier circuit (120) provides the optocoupler (20) with a filtered and amplified analog signal which is proportional to a pulse width modulation signal received at the input terminal of the amplifier circuit (120).

BRIEF DESCRIPTION OF THE DRAWINGS

The same reference number represents the same element on all drawings. It should be understood that the drawings are not necessarily to scale.

DETAILED DESCRIPTION

Figure 1:
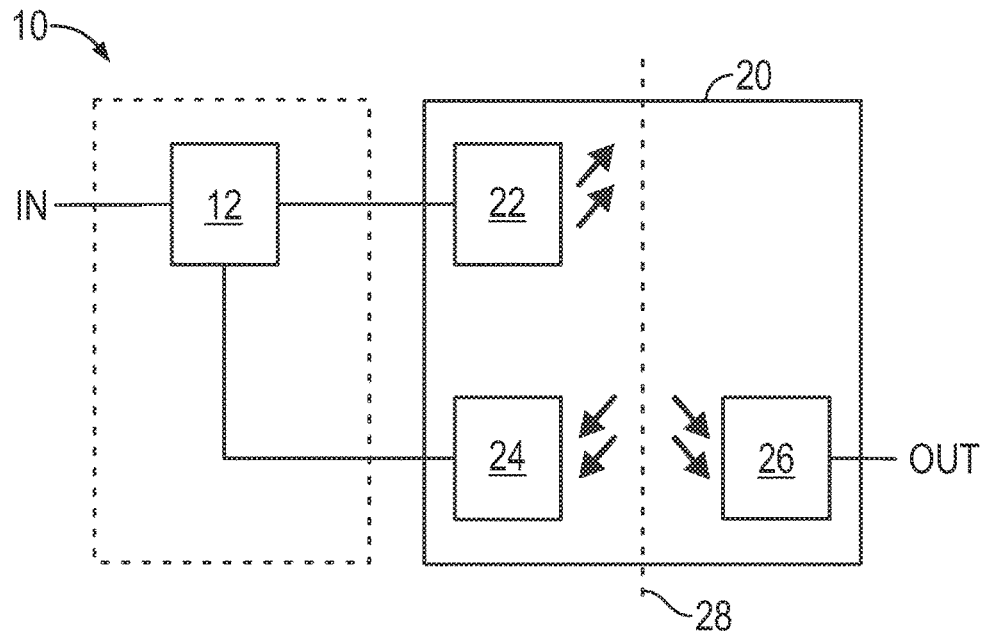
FIG. 1 shows a prior art optocoupler 20 communicatively coupled to a prior art optodriver circuit 10.
Figure 2:
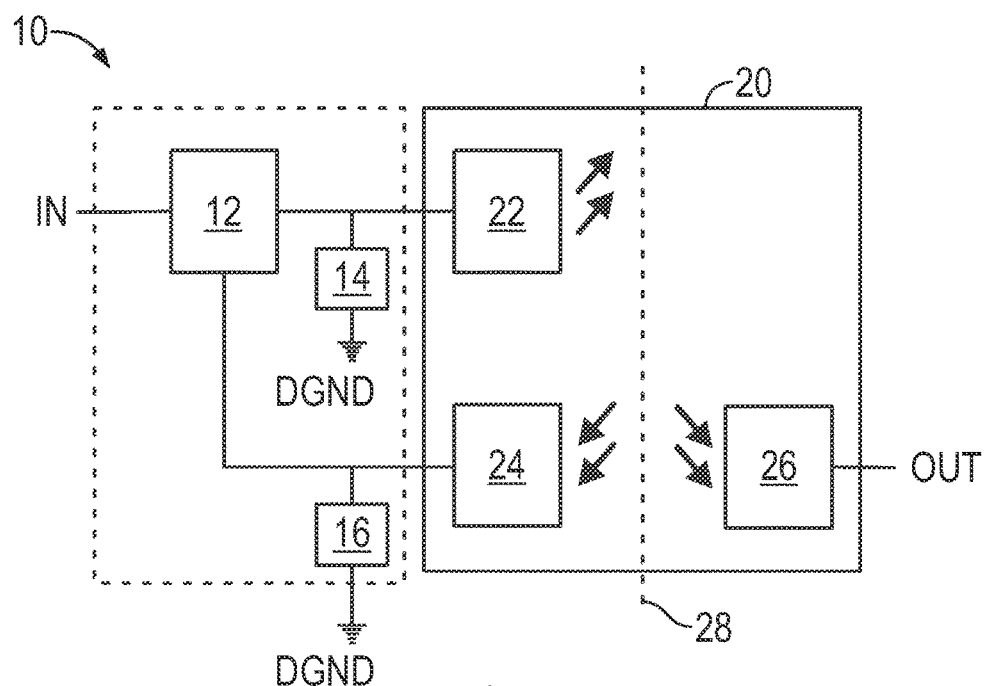
FIG. 2 shows the prior art optodriver circuit 10 which includes voltage limiters 14 and 16.
Figure 3:
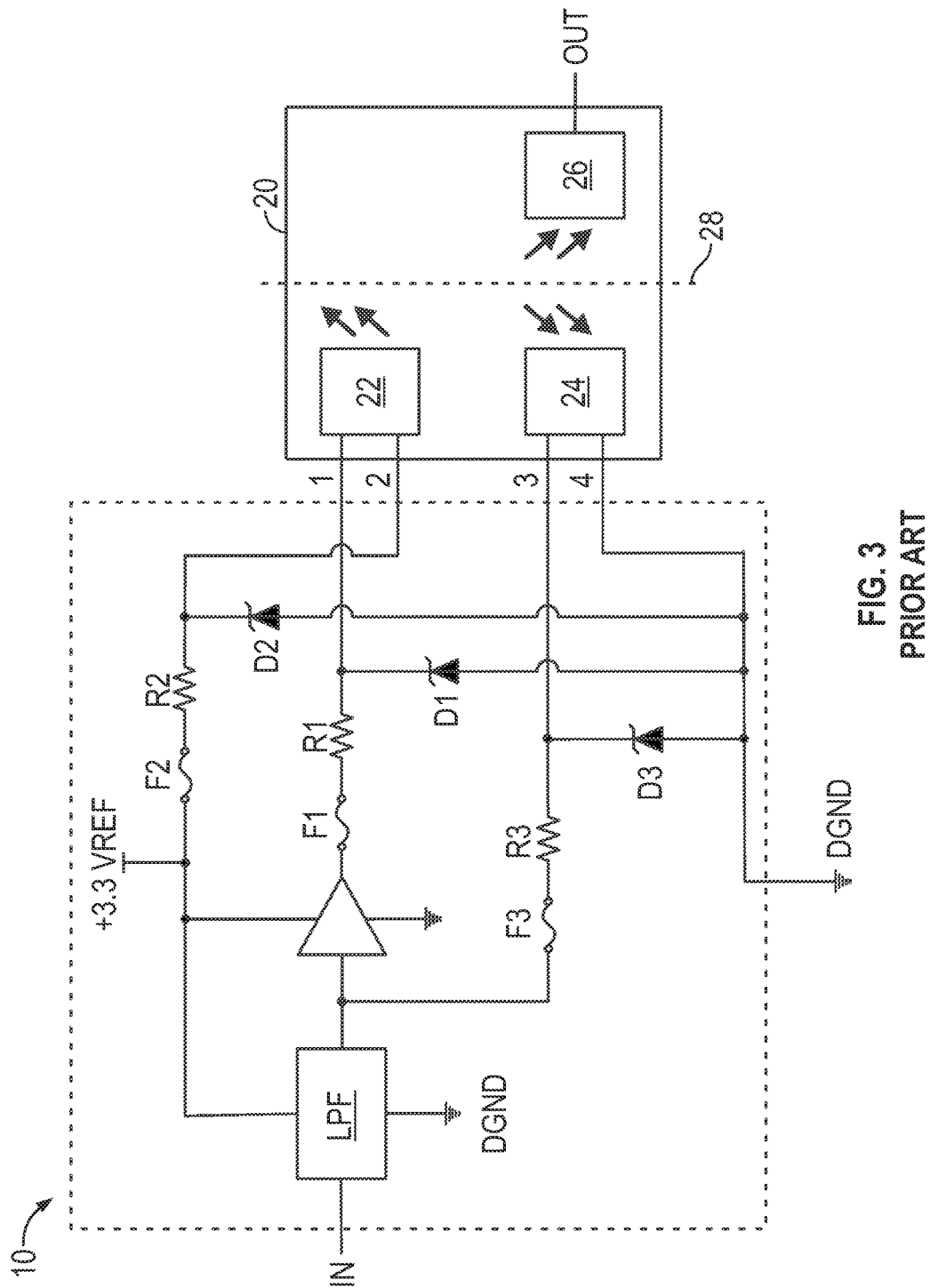
FIG. 3 shows a more detailed view of the prior art optodriver circuit 10.
Figure 4:
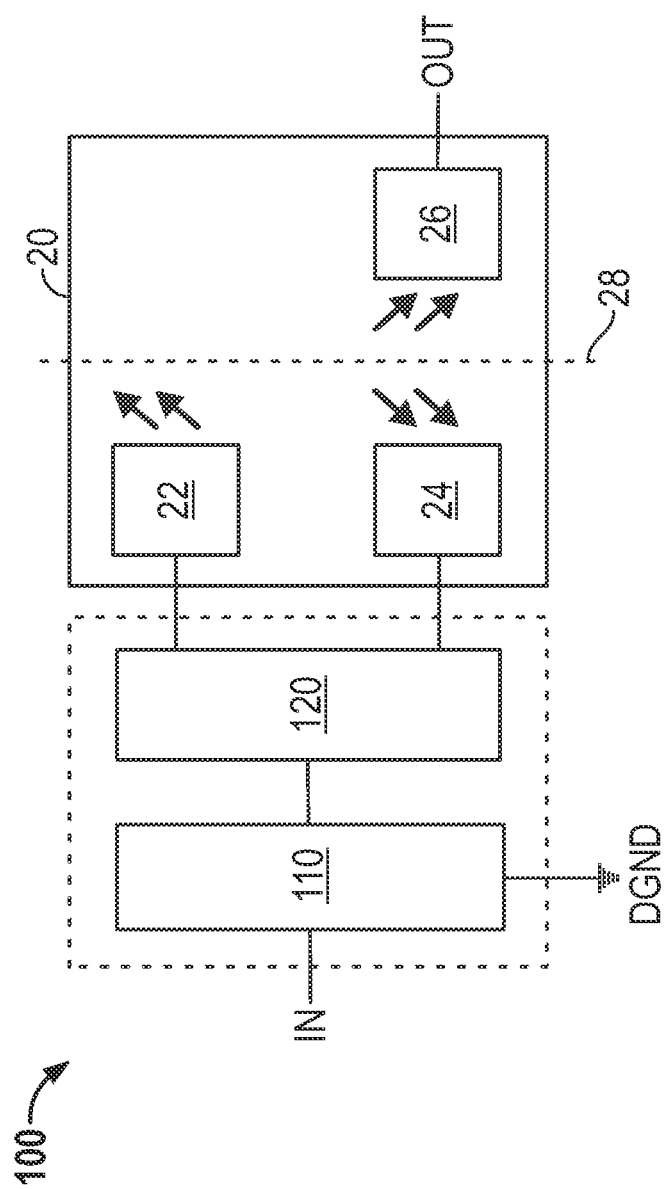
FIG. 4 shows an optodriver circuit 100 with an input protection circuit 110 for an optocoupler according to an embodiment.
Figure 5:
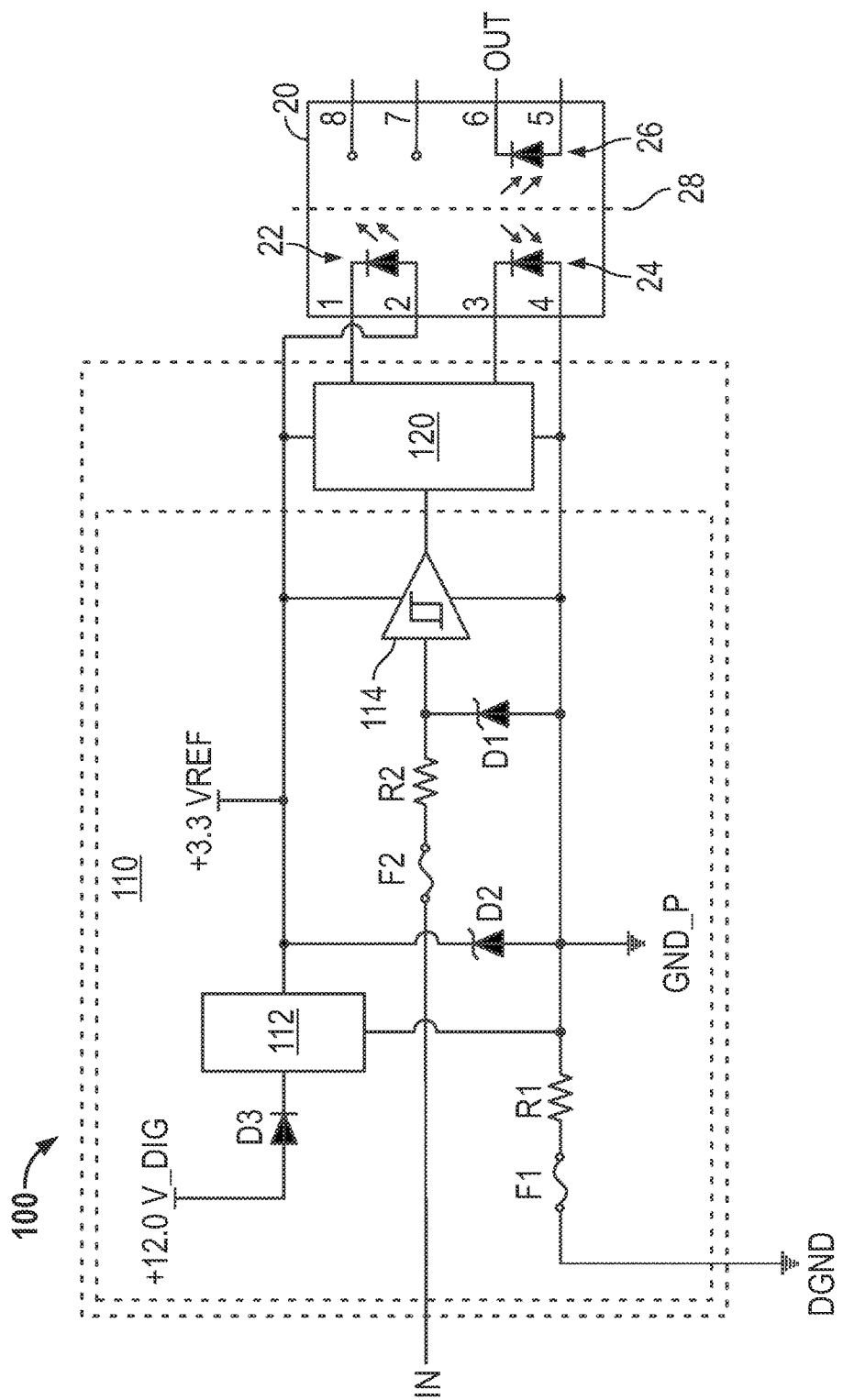
FIG. 5 shows a more detailed view of the optodriver circuit 100 and the input protection circuit 110 for the optocoupler.
Figure 6:
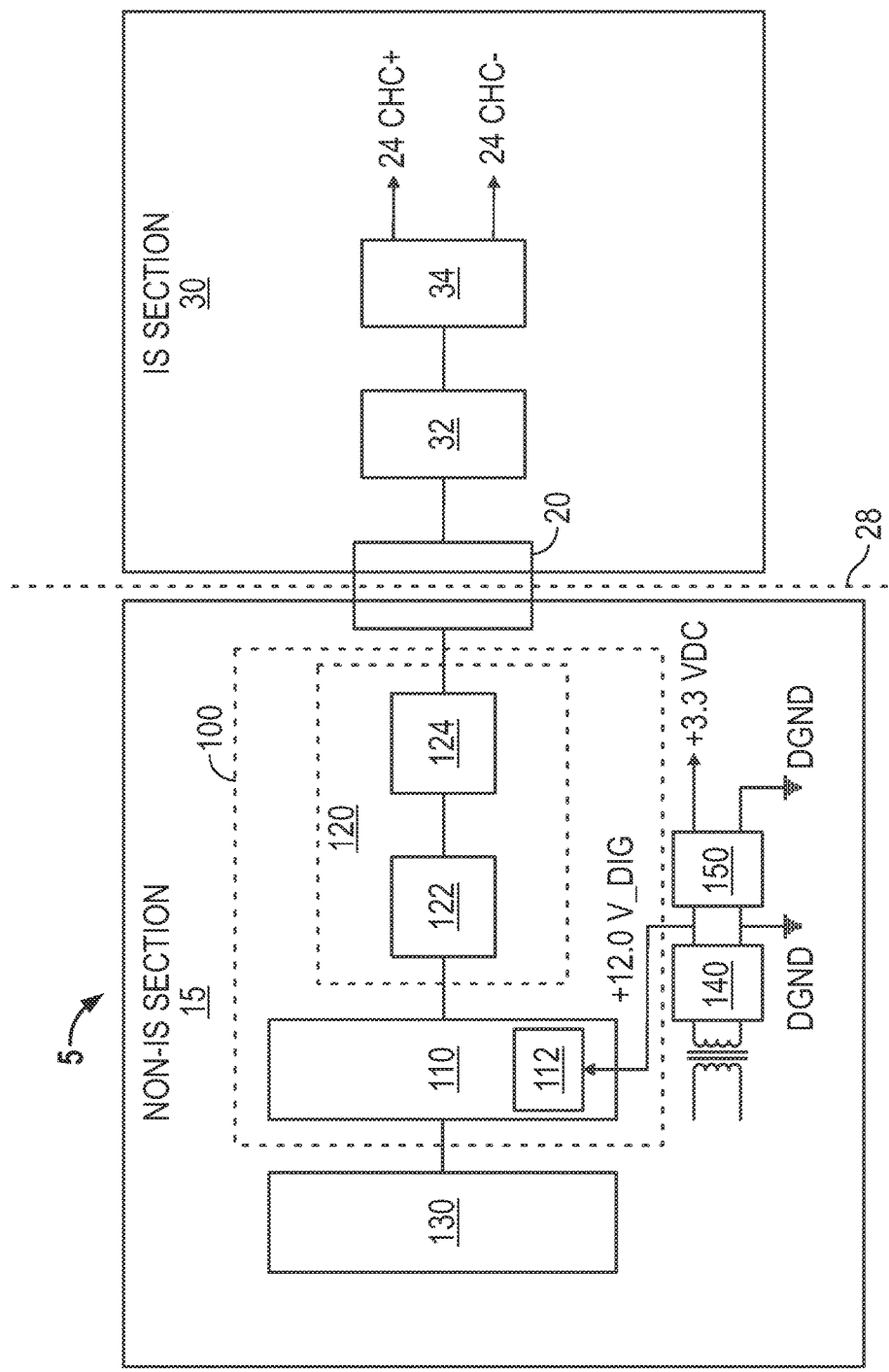
FIG. 6 shows the input protection circuit 110 being employed in a transmitter according to an embodiment.

FIGS. 4-6 and the following description depict specific examples to teach those skilled in the art how to make and use the best mode of embodiments of an input protection circuit for an analog optocoupler. For the purpose of teaching inventive principles, some conventional aspects have been simplified or omitted. Those skilled in the art will appreciate variations from these examples that fall within the scope of the present description. Those skilled in the art will appreciate that the features described below can be combined in various ways to form multiple variations of the input protection circuit for the analog optocoupler. As a result, the embodiments described below are not limited to the specific examples described below, but only by the claims and their equivalents.

FIG. 4 shows an optodriver circuit 100 with an input protection circuit 110 for an optocoupler according to an embodiment. The optodriver circuit 100 is communicatively coupled to the optocoupler 20 described in the foregoing. However, the optodriver circuit 100 may be communicatively coupled with any appropriate optocoupler in alternative embodiments. In the embodiment shown, the input protection circuit 110 is electrically coupled to an amplifier circuit 120 and a digital ground DGND. The amplifier circuit 120 is electrically coupled to the optocoupler 20. In particular, the amplifier circuit 120 is electrically coupled to the LED 22 and the first photodiode 24 via communication paths. The optodriver circuit 100 receives a signal at an input IN and provides the signal to the amplifier circuit 120. The amplifier circuit 120 is configured to drive the optocoupler 20. Accordingly, the optocoupler 20 provides a signal at an output OUT based on the signal received at the input IN.

The optocoupler 20 may be a high-linearity analog optocoupler, although any suitable optocoupler may be employed in alternative embodiments. In the optocoupler 20, light emitted by the LED 22 and received by the first photodiode 24 and second photodiode 26 are illustrated by arrows. As can be appreciated, the brightness of the light emitted by the LED 22 may be proportional to a signal received by the LED 22. Additionally, a signal provided by the second photodiode 26 may be proportional to the brightness of the light received by the second photodiode 26. However, the brightness of the light emitted by the LED 22 may vary with respect to the signal received by the LED 22 due to drift and non-linearity characteristics of the LED 22. Nevertheless, the signal provided by the optocoupler 20 at the output OUT may have a linear relationship with the signal received by the optodriver circuit 100 at the input IN, as is explained in more detail in the following.

The LED 22 emits light with a brightness that is proportional to a power consumed by the LED 22. For example, in the embodiment shown, the voltage provided to the LED 22 may be varied by the optodriver circuit 100. This varies the current drawn by the LED 22. Therefore, the brightness of the the light emitted by the LED 22 may be proportional to the power consumed by the LED 22.

Additionally, the first photodiode 24 and the second photodiode 26 may provide a voltage or current in proportion to the brightness of the light received. For example, the first photodiode 24 and second photodiode 26 may operate as a current source where the current provided by the first photodiode 24 or second photodiode 26 is proportional to the brightness of the light received. In addition, the first photodiode 24 and second photodiode 26 may be matched. That is, the current provided by the first photodiode 24 and the second photodiode 26 may be the same for a given brightness of the light emitted by the LED 22.

If the brightness of the light emitted by the LED 22 were to vary for a given voltage provided to the LED 22, then the optocoupler 20 may be employed to adjust the voltage provided to the LED 22. For example, if the brightness of the light emitted by the LED 22 were to decrease for the given voltage, then the current provided by the first photodiode 24 may correspondingly decrease. The amplifier circuit 120 may adjust the voltage provided to the LED 22. For example, the voltage provided to the LED 22 may decrease, which can increase the current drawn by the LED 22.

Therefore, the brightness of the light emitted by the LED 22 returns to the brightness prior to the adjustment to the voltage applied to the LED 22. Accordingly, the brightness of the light emitted by the LED 22 may remain the same for a given signal provided to the input IN. Since the current provided by the second photodiode 26 is proportional to the brightness of the light received, the linear relationship between the signal received at the input IN and the signal provided by the output OUT may be maintained even if the brightness of the emitted light from the LED 22 varies for the given voltage provided to the LED 22.

Additionally, as can be seen in FIG. 4, the input protection circuit 110 is coupled to the input side of the amplifier circuit 120 rather than coupled to the communication paths between the amplifier circuit 120 and the optocoupler 20. Accordingly, any leakage current that may be present in the input protection circuit 110 may not be drawn from the communication paths between the amplifier circuit 120 and the optocoupler 20, as is explained in more detail in the following with reference to FIG. 5.

FIG. 5 shows a more detailed view of the optodriver circuit 100 and the input protection circuit 110 for the optocoupler 20. As described in the foregoing with reference to FIG. 4, the optodriver circuit 100 includes the input protection circuit 110, which is coupled to the amplifier circuit 120. The amplifier circuit 120 receives a signal from the input IN via the input protection circuit 110 at an input terminal on the amplifier circuit 120. The optocoupler 20 is shown with input pins 1-4 and output pins 5-8.

In the embodiment shown, the input protection circuit 110 is electrically coupled to the second input pin 2 and the fourth input pin 4 on the optocoupler 20. The fourth input pin 4 on the optocoupler 20 is electrically coupled to a digital ground DGND via the input protection circuit 110. The amplifier circuit 120 is communicatively coupled to a first input pin 1 and a third input pin 3 on the optocoupler 20 via communications paths.

Input Protection Circuit

The input protection circuit 110 includes a voltage reference 112 that is coupled to the amplifier circuit 120 and the optocoupler 20. In the embodiment shown, an output terminal on the voltage reference 112 is coupled to a reference terminal on the amplifier circuit 120 and the second input pin 2 on the optocoupler 20. A +3.3 VREF supply is also coupled to the LED 22 via the second input pin 2 on the optocoupler 20 and the reference terminal on the amplifier circuit 120. A ground terminal on the voltage reference 112 is coupled to a protected ground GND_P.

The input protection circuit 110 also includes a first voltage limiter D1 with a first terminal that is coupled to the input terminal of the amplifier circuit 120 and a second voltage limiter D2 with a first terminal that is coupled to the output terminal of the voltage reference 112. The first and second voltage limiters D1, D2 also include second terminals that are coupled to the protected ground GND_P. As shown, the first and second voltage limiters D1, D2 are Zener diodes although any suitable voltage limiter may be employed in alternative embodiments.

As can also be seen in FIG. 5, the input protection circuit 110 also includes a first fuse F1 and a first resistor R1 that are in series with the protected ground GND_P terminal. A second fuse F2 and a second resistor R2 are in series with the input terminal on the amplifier circuit 120. A blocking diode D3 includes a first terminal coupled to an input terminal on the voltage reference 112 and a second terminal coupled to a +12.0 V_DIG supply.

In the embodiment shown, an input on a buffer 114 is electrically coupled to the first terminal on the first voltage limiter D1. An output on the buffer 114 is electrically coupled to the input on the amplifier circuit 120. A first reference terminal on the buffer 114 is coupled to the +3.3 VREF supply. A second reference terminal on the buffer 114 is electrically coupled to the protected ground GND_P. As shown, the buffer 114 is a Schmitt trigger buffer.

In the embodiment shown, the amplifier circuit 120 is electrically coupled to the LED 22 over a first communication path via the first input pin 1 on the optocoupler 20. The amplifier circuit 120 is also electrically coupled over a second communication path to the first photodiode 24 via the third input pin 3 on the optocoupler 20. The first photodiode 24 is electrically coupled to the protected ground GND_P via the fourth input pin 4 on the optocoupler 20. The input terminal on the amplifier circuit 120 is communicatively coupled to the input IN via the second fuse F2 and the second resistor R2. Other configurations may be employed in alternative embodiments.

Operation of the Amplifier Circuit and the Optocoupler

In operation, the voltage reference 112 may maintain a reference voltage in the amplifier circuit 120. For example, the amplifier circuit 120 may include an operational amplifier with a reference pin. The voltage reference 112 may maintain the voltage on the reference pin at the +3.3 VREF voltage over a range of currents drawn by the amplifier circuit 120. That is, the reference voltage may be the +3.3 VREF voltage. The voltage reference 112 may also provide the protected voltage to the second input pin 2 on the optocoupler 20.

Accordingly, if the voltage applied to the first input pin 1 on the optocoupler 20 is 0.0 volts, then the LED 22 will be conducting a current that corresponds to the reference voltage. That is, the current is proportional to the +3.3 VREF divided by the resistance of the LED 22 and any other resistance in the current path, such as resistance in the amplifier circuit 120. When the LED 22 is conducting the reference current, the brightness of the light emitted by the LED 22 may be at a maximum. In addition, if the voltage on the first input pin 1 is +3.3 volts then the voltage difference between the first input pin 1 and second input pin 2 on the optocoupler 20 is zero. Accordingly, there will be no current through the LED 22 and, therefore, the LED 22 may not emit light.

The first photodiode 24 may provide a current due to the light emitted by the LED 22. For example, when the first photodiode 24 receives the light emitted by the LED 22, the first photodiode 24 may operate as a current source and draw a current from the amplifier circuit 120. However, in alternative embodiments, the first photodiode 24 may operate in other modes. In the embodiment shown, the first photodiode 24 may draw the current from the amplifier circuit 120 via the third input pin 3 on the optocoupler 20, and the amplifier circuit 120 may vary the voltage provided to the LED 22 to compensate and maintain a constant current in the first photodiode 24.

The amplifier circuit 120 may control the current drawn by the LED 22 by controlling the voltage on the first input pin 1. For example, the amplifier circuit 120 may include an operational amplifier that drives the first input pin 1 between zero and the +3.3 VREF depending on the voltage of the signal provided to the input terminal of the amplifier circuit 120. The magnitude of the voltage at the input terminal of the amplifier circuit 120 may be proportional to a PWM signal on the input IN of the optodriver circuit 100. Therefore, if the brightness of the light emitted from the LED 22 were to drift from a nominal brightness for a given voltage applied to the first input pin 1, then the voltage applied to the first input pin 1 will correspondingly change.

In addition, the first, third, and fourth input pins 1, 3, 4 are not coupled to voltage limiters. For example, the first, third, and fourth input pins 1, 3, 4 are not coupled to a ground via Zener diodes. As a result, the relationship between the voltage on the first input pin 1 and the current provided by the first photodiode 24 may be consistent. Additionally, the input protection circuit 110 may still ensure that the voltages on the input pins 1-4 do not exceed a safety regulation voltage, as is explained in more detail in the following.

Operation of the Input Protection Circuit

As discussed in the foregoing, the safety regulations require that the voltages on the input pins 1-4 be limited to the safety regulation voltage. In the embodiment shown, the second voltage limiter D2 prevents the voltage on the second input pin 2 from exceeding a breakdown voltage of the second voltage limiter D2, which is less than the safety regulation voltage. More specifically, if the voltage on the second input pin 2 were to exceed the breakdown voltage, then current will flow from the second input pin 2 to the protected ground GND_P and from the protected ground GND_P through the first fuse F1 and first resistor R1 to the digital ground DGND.

The first voltage limiter D1 along with the second voltage limiter D2 similarly prevents the first input pin 1 and third input pin 3 from exceeding the breakdown voltage. For example, if the voltage on the input terminal of the amplifier circuit 120 were to exceed the breakdown voltage of the first voltage limiter D1, then the first voltage limiter D1 will conduct current from the input terminal of the amplifier circuit 120 to the protected ground GND_P and from the protected ground GND_P through the first fuse F1 and first resistor R1 to the digital ground DGND. Accordingly, voltage on the first input pin 1 and third input pin 3 may not exceed the safety regulation voltage.

If the current conducted by the first and second voltage limiters D1, D2 is excessive, then the first and second voltage limiters D1, D2 may fail. For example, if the input terminal on the amplifier circuit 120 were to be at the breakdown voltage due to the current being drawn by the first voltage limiter D1 for a period of time, then the material in the first voltage limiter D1 may disintegrate due to heating.

The first fuse F1 may prevent such a failure from occurring. For example, if the current is flowing through the first voltage limiter D1 from the input terminal on the amplifier circuit 120 to the digital ground DGND, then the first fuse F1 may blow, thereby electrically decoupling the input terminal from the digital ground DGND. Similarly, if the current is flowing through the second voltage limiter D2 to the digital ground DGND, and exceeds the current capacity of the first fuse F1, then the first fuse F1 may blow, thereby electrically decoupling the second input pin 2 from the digital ground DGND.

The second fuse F2 may prevent excessive current flow from the input terminal on the amplifier circuit 120 to the input IN of the input protection circuit 110. For example, if the voltage on the input terminal of the amplifier circuit 120 is due to a high voltage on the +12.0 V_DIG, there may be an excessive current from the input terminal on the amplifier circuit 120 to the input IN. Accordingly, the second fuse F2 may blow, thereby electrically decoupling the input terminal on the amplifier circuit 120 from the input IN.

In the embodiment shown, the input IN may be a PWM signal with undesirably varying amplitude. Additionally or alternatively, the modulations of the PWM signal received at the input IN may also be adversely affected by the second resistor R2 and the first voltage limiter D1. The buffer 114 may include thresholds or triggers that convert the PWM signal with the undesirably varying amplitude to a desirable PWM signal. For example, a PWM signal with a pulse voltage that varies from +3.0 to +2.4 VDC and a ground voltage that varies from 0.0 to +1.2 VDC may be received by the buffer 114. The buffer 114 may have a positive threshold set at +2.5 VDC and a negative threshold set at +1.0 VDC. When the PWM signal received at the input of the buffer 114 exceeds the threshold voltages, the output may be a PWM signal with a pulse voltage of +3.3 VDC and a ground voltage of 0.0 VDC. Accordingly, the PWM signal received at the input of the amplifier circuit 120 may not have the undesirable amplitude.

The foregoing describes the structure and operation of the optodriver circuit 100 and the input protection circuit 110. The following describes the input protection circuit 110 employed in an exemplary transmitter that may be coupled to a flow measurement device, such as a flow meter.

Exemplary Application of the Input Protection Circuit

FIG. 6 shows the input protection circuit 110 being employed in a transmitter 5 according to an embodiment. The transmitter 5 may be for, for example, a flow meter, such as those manufactured by Micro Motion, Inc. The transmitter 5 is comprised of a non-IS section 15, the optocoupler 20, and an IS section 30. The non-IS section 15 includes the input protection circuit 110 and the amplifier circuit 120 described in the foregoing. The non-IS section 15 also includes a microprocessor 130. The input protection circuit 110 is in the optodriver circuit 100, which is coupled to the IS section 30 of the transmitter 5 via the optocoupler 20. The non-IS section 15 and the IS section 30 are separated by the isolation barrier 28 in the optocoupler 20.

As shown in FIG. 6, the non-IS section 15 includes a rectifier 140 that receives an AC power from a power supply. The rectifier 140 provides the 12 volts digital supply voltage +12.0_DIG. The rectifier 140 is coupled to a voltage regulator 150, which provides a +3.3 VDC power supply. This +3.3 VDC power supply is used to power the non-IS section 15 excluding the optodriver circuit 100. The voltage reference 112, which is in the input protection circuit 110, is coupled to the 12 volts digital supply voltage +12.0_DIG. In addition, the input protection circuit 110 is coupled to the amplifier circuit 120 as described in the foregoing. In particular, the input protection circuit 110 is coupled to a filter 122, which is coupled to an operational amplifier 124. The operational amplifier 124 is communicatively coupled to the optocoupler 20. Accordingly, the input protection circuit 110 is not coupled to the communication path between the amplifier circuit 120 and the optocoupler 20. The input protection circuit 110 is also communicatively coupled to the microprocessor 130 and, in the embodiment shown, receives a PWM signal from the microprocessor 130.

As can be appreciated, the PWM signal is filtered by the filter 122 and amplified by the operational amplifier 124. For example, the filter 122 may be a low pass filter that filters noise or high frequency components from the PWM signal and generates a voltage proportional to the PWM signal. This voltage, which is proportional to the PWM signal, is provided to the operational amplifier 124. The operational amplifier 124 may also amplify the voltage, which may range from 0.0 to the +3.3 VDC.

The optocoupler 20 receives and converts the filtered PWM signal into light, as described in the foregoing. The light is transmitted across the isolation barrier 28 from the non-IS portion to the IS portion of the optocoupler 20. Therefore, the PWM signal provided by the microprocessor 130 may be received by the IS section 30 without being electrically coupled to the non-IS section 15. As a result, electrical power in the non-IS section 15 may not conduct to the IS section 30.

The IS section 30 is shown as being comprised of an operational amplifier 32 that is communicatively coupled to the optocoupler 20 and a voltage-to-current converter 34. The voltage-to-current converter 34 may provide, for example, a 4 to 20 mA current, which is proportional to the PWM signal generated by the microprocessor 130. Accordingly, the transmitter 5 may set the 4-20 mA loop current in the IS section 30. In addition, due to the input protection circuit 110 not being coupled to a communication path between the amplifier circuit 120 and the optocoupler 20, the PWM signal provided by the microprocessor 130 may have a linear relationship with the signal provided by the optocoupler 20 to the operational amplifier 32. Therefore, the 4-20 mA set by the voltage-to-current converter 34 may be proportional to the PWM signal provided by the microprocessor 130.

The foregoing describes an input protection circuit 110 for an optocoupler 20. The input protection circuit 110 may prevent the voltages on the input pins 1-4 of the optocoupler 20 from exceeding a safety regulation voltage. Additionally, the input protection circuit 110 may not cause a current draw from the first and third input pin 1, 3 on the optocoupler 20. For example, in the embodiment described in the foregoing, the voltage limiters D1 and D2 are not electrically coupled to the first input pin 1 and the third input pin 3, which are used to regulate the voltage supplied to the LED 22.

Accordingly, there is no leakage current being drawn from the first input pin 1 and the third input pin 3. As a result, the current through the LED 22 as well as the voltage applied by the amplifier circuit 120 to the first input pin 1 may not vary due to any leakage current in the input protection circuit 110. The voltage applied by the amplifier circuit 120 may be proportional to the voltage at the input pin on the operational amplifier 124. The amplifier circuit 120 may compensate and maintain a constant current in the first photodiode 24 proportional to the voltage at the input pin on the operational amplifier 124. This may ensure that the output OUT from the optocoupler 20 has a linear relationship with the input IN to the optodriver circuit 100.

The detailed descriptions of the above embodiments are not exhaustive descriptions of all embodiments contemplated by the inventors to be within the scope of the present description. Indeed, persons skilled in the art will recognize that certain elements of the above-described embodiments may variously be combined or eliminated to create further embodiments, and such further embodiments fall within the scope and teachings of the present description. It will also be apparent to those of ordinary skill in the art that the above-described embodiments may be combined in whole or

We claim:

1. An input protection circuit (110) for an optocoupler (20), comprising:
   a first voltage limiter (D1) with a first terminal that is electrically coupled to an input terminal of an amplifier circuit (120), wherein:
      the input terminal of the amplifier circuit (120) is configured to receive a PWM signal; and
      the amplifier circuit (120) is configured to provide a voltage to the optocoupler (20); and
   a second voltage limiter (D2) having a first terminal, wherein the first terminal of the second voltage limiter (D2) is electrically coupled to a voltage reference (112) that provides a protected voltage to the optocoupler (20) and the amplifier circuit (120).

2. The input protection circuit (110) of claim 1, further comprising a buffer (114) with an input terminal electrically coupled to the first terminal of the first voltage limiter (D1) and an output terminal electrically coupled to the input terminal of the amplifier circuit (120).

3. The input protection circuit (110) of claim 1, wherein:
   the first voltage limiter (D1) further comprises a second terminal, wherein the second terminal of the first voltage limiter (D1) is coupled to a protected ground (GND_P); and
   the second voltage limiter (D2) further comprises a second terminal, wherein the second terminal of the second voltage limiter (D2) is coupled to a protected ground (GND_P).

4. The input protection circuit (110) of claim 1, further comprising a voltage reference (112) that is electrically coupled to the amplifier circuit (120) to provide a reference voltage to the amplifier circuit (120).

5. The input protection circuit (110) of claim 1, further comprising a first fuse (F1) coupled between a protected ground (GND_P) and a digital ground (DGND).

6. The input protection circuit (110) of claim 1, further comprising a second fuse (F2) coupled to an input terminal on the amplifier circuit (120).

7. The input protection circuit (110) of claim 1, wherein the amplifier circuit (120) is electrically coupled to a light emitting diode (22) and a first photodiode (24) in the optocoupler (20), wherein the amplifier circuit (120) controls a voltage applied to the light emitting diode (22) based on a signal provided at an input pin (IN) to compensate and maintain a constant current in the first photodiode (24).

8. An optodriver circuit (100), comprising:
   an amplifier circuit (120) that is configured to provide a voltage to an optocoupler (20); and
   an input protection circuit (110) comprising:
      a first voltage limiter (D1) with a first terminal, wherein the first terminal is electrically coupled to an input terminal on the amplifier circuit (120) and the input terminal on the amplifier circuit (120) is configured to receive a PWM signal; and
      a second voltage limiter (D2) having a first terminal, wherein the first terminal of the second voltage limiter (D2) is electrically coupled to a voltage reference (112) that provides a protected reference voltage to the optocoupler (20) and an amplifier circuit (120).

9. The optodriver circuit (100) of claim 8, further comprising a buffer (114) with an input terminal electrically coupled to the first terminal of the first voltage limiter (D1) and an output terminal electrically coupled to the input terminal of the amplifier circuit (120).

10. The optodriver circuit (100) of claim 8, wherein:
    the first voltage limiter (D1) further comprises a second terminal, wherein the second terminal of the first voltage limiter (D1) is coupled to a protected ground (GND_P); and
    the second voltage limiter (D2) further comprises a second terminal, wherein the second terminal of the second voltage limiter (D2) is coupled to a protected ground (GND_P).

11. The optodriver circuit (100) of claim 8, further comprising a voltage reference (112) that is electrically coupled to the amplifier circuit (120) to provide a reference voltage and a protected voltage to the amplifier circuit (120).

12. The optodriver circuit (100) of claim 8, wherein the amplifier circuit (120) is electrically coupled to a light emitting diode (22) and a first photodiode (24) in the optocoupler (20), wherein the amplifier circuit (120) controls a voltage applied to the light emitting diode (22) based on a signal provided at an input pin (IN) to compensate and maintain a constant current in the first photodiode (24).

* * * * *